(12) United States Patent
Houssameddine et al.

(10) Patent No.: US 11,563,054 B2
(45) Date of Patent: Jan. 24, 2023

(54) MJT BASED ANTI-FUSES WITH LOW PROGRAMMING VOLTAGE

(71) Applicant: International Business Machines Corporation, Armonk, NY (US)

(72) Inventors: Dimitri Houssameddine, White Plains, NY (US); Chandrasekharan Kothandaraman, New York, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/360,527

(22) Filed: Mar. 21, 2019

(65) Prior Publication Data

US 2020/0303452 A1 Sep. 24, 2020

(51) Int. Cl.
*H01L 27/22* (2006.01)
*H01L 43/12* (2006.01)
*G11C 17/02* (2006.01)
*H01L 43/02* (2006.01)
*H01L 43/08* (2006.01)

(52) U.S. Cl.
CPC ............ *H01L 27/224* (2013.01); *G11C 17/02* (2013.01); *H01L 43/02* (2013.01); *H01L 43/08* (2013.01); *H01L 43/12* (2013.01)

(58) Field of Classification Search
CPC ......... H01L 43/02; H01L 43/08; H01L 43/12; H01L 27/224; G11C 17/02
USPC ....................................................... 257/421
See application file for complete search history.

(56) References Cited

U.S. PATENT DOCUMENTS

| | | | |
|---|---|---|---|
| 6,483,734 B1 | 11/2002 | Sharma et al. |
| 6,767,816 B2 | 7/2004 | Kleveland et al. |
| 9,343,176 B2 | 5/2016 | Chung |
| 9,496,265 B2 | 11/2016 | Chung |
| 9,614,144 B1 | 4/2017 | Annunziata et al. |

(Continued)

FOREIGN PATENT DOCUMENTS

| | | |
|---|---|---|
| WO | 2014/039565 A1 | 3/2014 |
| WO | 2016/160578 A1 | 10/2016 |

OTHER PUBLICATIONS

Sharad, M., et al., "Ultra-low Energy, High Performance and Programmable Magnetic Threshold Logic", https://arxiv.org/ftp/arxiv/papers/1308/1308.4169.pdf, 4 pages, Aug. 8, 2013.

(Continued)

*Primary Examiner* — Lex H Malsawma
*Assistant Examiner* — Eric W Jones
(74) *Attorney, Agent, or Firm* — Scully, Scott, Murphy & Presser, P.C.; Daniel P. Morris, Esq.

(57) ABSTRACT

A memory element and methods of constructing the memory element are described. The memory element may include a bottom electrode structure having an uppermost portion of a first dimension. The memory element may further include a MTJ pillar having a bottommost portion forming an interface with the uppermost portion of the bottom electrode structure. The bottommost portion of the MTJ pillar may have a second dimension that is less than the first dimension. The memory element may further include oxidized metal particles located on an outermost sidewall of the MTJ pillar. The memory element may further include a top electrode structure located in the MTJ pillar.

9 Claims, 3 Drawing Sheets

(56) References Cited

U.S. PATENT DOCUMENTS

| | | | | |
|---|---|---|---|---|
| 2013/0307099 A1* | 11/2013 | Kitagawa | ................ | H01L 43/08 |
| | | | | 257/421 |
| 2013/0341801 A1* | 12/2013 | Satoh | .................... | H01L 27/222 |
| | | | | 257/E21.585 |
| 2014/0131649 A1* | 5/2014 | Daibou | ................... | H01L 43/08 |
| | | | | 257/2 |
| 2014/0264463 A1* | 9/2014 | Chou | ...................... | H01L 43/12 |
| | | | | 257/252 |
| 2015/0069554 A1* | 3/2015 | Nakayama | .............. | H01L 43/02 |
| | | | | 257/421 |
| 2016/0072055 A1* | 3/2016 | Seto | ........................ | H01L 43/12 |
| | | | | 438/3 |
| 2017/0069835 A1* | 3/2017 | Sonoda | ................... | H01L 43/12 |
| 2018/0075906 A1 | 3/2018 | Chung | | |

OTHER PUBLICATIONS

Jan, G., et al., "Demonstration of an MgO Based Anti-Fuse OTP Design Integrated With a Fully Functional STT-MRAM at the Mbit Level", 2015 Symposium on VLSI Technology Digest of Technical Papers, pp. T164-T165.

\* cited by examiner

MJT BASED ANTI-FUSES WITH LOW PROGRAMMING VOLTAGE

BACKGROUND

The present application relates to a magnetic tunnel junction (MTJ) containing device and a method of forming the same. More particularly, the present application relates to one-time programmable (OTP) memory elements utilizing magnetoresistive random access memory (MRAM) bits with reduced breakdown voltage.

Magnetoresistive random access memory (MRAM) is a non-volatile random access memory technology in which data is stored by magnetic storage elements. These elements are typically formed from two ferromagnetic plates, each of which can hold a magnetization, separated by a thin dielectric layer, i.e., the tunnel barrier. One of the two plates is a permanent magnetic set to a particular polarity; the other plate's magnetization can be changed to match that of an external field to store memory. Such a configuration is known as a magnetic tunnel junction (MTJ) pillar.

In some examples, MTJs used in MRAM can be used in one-time programmable (OTP) memory elements or bits. Data is written to an OTP bit by applying an amount of voltage exceeding a breakdown voltage of the MTJ to cause an electrical short, or to blow a fuse. An OTP bit, without voltage being applied, is registered as a logic '1'. The occurrence of the electrical short causes the OTP bit to register a logic '0'. The electrical short can be irreversible, thus causing a '0' to be permanently written in the OTP bit. However, the relatively high programming voltage required to program the OTP bits (e.g., the voltage to cause a breakdown) may lead to various technical challenges such as low drive current from access transistors, large area of programming circuitry, reliability of unselected devices, and/or other technical challenges.

To write data to the OTP bits with less programming voltage, the breakdown voltage of the OTP bits may need to be reduced. In some examples, OTP bits can be manufactured at smaller sizes to reduce the breakdown voltage. However, the OTP bits and corresponding devices printed in smaller sizes can cause manufacturing control issues. In some examples, it may be advantageous to use MTJ based anti-fuses as OTP elements in memory devices. MRAM bits can be relatively larger in size when compared to OTP bits. However, MRAM bits can be designed to have a relatively high breakdown voltage to provide a feature of rewriting data to the MRAM bit multiple times without causing accidental breakdowns. Based on this feature, MRAM bits may be typically used in multi-time programmable (MTP) memory elements.

SUMMARY

In some examples, a memory element is generally described. The memory element includes a bottom electrode structure having an uppermost portion of a first dimension. The memory element further includes a MTJ pillar having a bottommost portion forming an interface with the uppermost portion of the bottom electrode structure. The bottommost portion of the MTJ pillar has a second dimension that is less than the first dimension. The memory element further includes oxidized metal particles located on an outermost sidewall of the MTJ pillar. The memory element further includes a top electrode structure located on the MTJ pillar.

In some examples, a method of forming a one-time programmable (OTP) memory element is generally described. The method includes forming a multilayered magnetic tunnel junction (MTJ) stack on an uppermost portion of a bottom electrode structure. The uppermost portion of the bottom electrode structure has a first dimension. The method further includes disposing a top electrode structure on the multilayered MTJ stack. The method further includes etching the multilayered MTJ stack utilizing the top electrode structure as an etch mask to provide a MTJ pillar having a bottommost portion of a second dimension less than the first dimension. The bottommost portion of the MTJ pillar forms an interface with the uppermost portion of the bottom electrode structure. The etching causes metal particles from the bottom electrode structure to deposit on an outermost sidewall of the MTJ pillar. The method further includes oxidizing the deposited metal particles to form oxidized metal particles on the outermost sidewall of the MTJ pillar.

In some examples, a memory device is generally described. The memory device includes a first memory element and a second memory element. The first memory element includes a first bottom electrode structure having an uppermost portion of a first dimension. The first memory element further includes a first MTJ pillar having a bottommost portion forming an interface with the uppermost portion of the first bottom electrode structure. The bottommost portion of the first MTJ pillar has a second dimension that is less than the first dimension. The first memory element further includes oxidized metal particles located on an outermost sidewall of the first MTJ pillar. The first memory element further includes a top electrode structure located on the first MTJ pillar. The second memory element includes a second bottom electrode structure having an uppermost portion of a third dimension. The second memory element further includes a second MTJ pillar having a bottommost portion of a fourth dimension that is greater than or equal to the third dimension.

DETAILED DESCRIPTION

Figure 1:
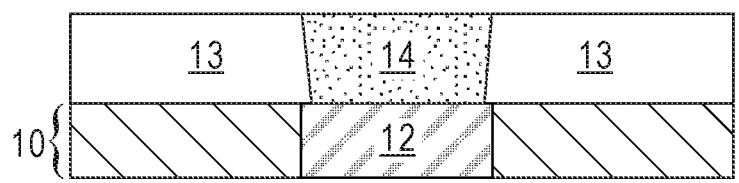
FIG. 1 is a cross sectional view of an exemplary structure of the present application during an early stage of fabrication, the structure including a bottom electrode structure located on a surface of an electrically conductive structure that is embedded in an interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In some examples, MRAM bits may be utilized as OTP bits, but the breakdown voltage of the MRAM bits may need to be reduced. To be described in more detail below, an OTP structure with reduced programming voltage can be constructed by changing edge conditions of MRAM bits that include MTJ pillars. For example, an OTP structure may be composed of a MTJ pillar connected to a bottom electrode of a relatively larger size (e.g., larger lateral dimension than the MTJ pillar). As such, sputtered material in the form of metal particles from the relatively larger bottom electrode is re-deposited on a sidewall of the MTJ pillar during a patterning process of the OTP bit. The material of the bottom electrode can be chosen to interact with the tunnel barrier layer of the MTJ pillar and reduce its breakdown voltage. Therefore, the programming voltage of the constructed OTP bits can be reduced. Further, the OTP bits can be constructed on a wafer that includes other MRAM bits without impacting the MRAM bits on the same wafer.

FIG. 1 is a cross sectional view of an exemplary structure of the present application during an early stage of fabrication. The structure may provide or include a bottom electrode structure 14 located on a surface of an electrically conductive structure 12 that is embedded in an interconnect dielectric material layer 10. Although not shown, a diffusion barrier liner may be formed on the sidewalls and bottom wall of the electrically conductive structure 12. Collectively, the electrically conductive structure 12, the diffusion barrier liner (if present), and the interconnect dielectric material layer 10 provide an interconnect level It is noted that at least one other interconnect level and/or a middle-of-the-line (MOL) level may be located beneath the interconnect level including the interconnect dielectric material layer 10, the electrically conductive structure 12, and, if present, diffusion barrier liner. These other levels are not shown for clarity.

The interconnect dielectric material layer 10 can be composed of any interconnect dielectric material including, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The electrically conductive structure 12 can be composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

In some embodiments, a diffusion barrier liner can be formed along the sidewalls and a bottom wall of the electrically conductive structure 12. In some embodiments, no diffusion barrier liner is present. The diffusion barrier liner is composed of a diffusion barrier material (i.e., a material that serves as a barrier to prevent a conductive material such as copper from diffusing there through). Examples of diffusion barrier materials that can be used in providing the diffusion barrier liner include, but are not limited to, Ta, TaN, Ti, TiN, Ru, RuN, RuTa, RuTaN, W, or WN. In some embodiments, the diffusion barrier material may include a material stack of diffusion barrier materials. In one example, the diffusion barrier material may be composed of a stack of Ta/TaN.

The interconnect level including the interconnect dielectric material layer 10, the electrically conductive structure 12, and, if present, the diffusion barrier liner can be formed utilizing conventional processes that are well-known to those skilled in the art including, for example, a damascene process. So as not to obscure the method of the present application, the techniques used to form the interconnect level including the interconnect dielectric material layer 10, the electrically conductive structure 12, and, if present, diffusion barrier liner are not provided herein.

Bottom electrode structure 14, which is located on a uppermost, or topmost, surface or portion of the electrically conductive structure 12, can be composed of a conductive material such as, for example, Ta, TaN, Ti, TiN, Ru, RuN, RuTa, RuTaN, Co, Cu, CoWP, CoN, W, WN or any combination thereof. The bottom electrode structure 14 may have a thickness from 2 nm to 25 nm; other thicknesses are possible and can be used in the present application as the thickness of the bottom electrode structure 14. The conductive material that provides the bottom electrode structure 14 can be formed by deposition processes such as, for example, sputtering, atomic layer deposition (ALD), chemical vapor deposition (CVD), plasma enhanced chemical vapor deposition (PECVD) or physical vapor deposition (PVD).

The bottom electrode structure 14 can be of an arbitrary size and/or shape and it has an uppermost portion of a first dimension. In some embodiments, the bottom electrode structure 14 may have vertical sidewalls. In such an embodiment, the entirety of the bottom electrode structure 14 has the first dimension. In other embodiments, the bottom electrode structure 14 may have tapered sidewalls that decrease downward from the topmost surface of the bottom electrode structure 14 to the bottommost surface of the bottom electrode structure 14. In such an embodiment, the dimension of the bottom electrode structure 14 decreases from top to bottom. The bottom electrode structure 14 can be formed by processes well-known to those skilled in the art including, for example an etch back process, a planarization process (such as, for example, chemical mechanical polishing), or a patterning process (such as, for example, lithography and etching). In an example embodiment, the bottom electrode structure 14 can be formed on a non-recessed surface or portion of the electrically conductive structure 12. In such an embodiment, a dielectric capping layer 13 is located laterally adjacent to the bottom electrode structure 14 and on a surface of the interconnect dielectric material layer 10. In this embodiment, a smaller width bottom electrode structure 14 can be provided that does not cover the entirety of the uppermost surface of the electrically conductive structure 12. It is noted that the bottom electrode structure 14 can be of an arbitrary size, shape, dimensions, and the bottom electrode structure 14 can have dimensions greater than or less than the dimensions of the electrically conductive structure 12.

When present, the dielectric capping layer 13 can be composed of any dielectric material such as, for example, SiC, $Si_3N_4$, $SiO_2$, a carbon doped oxide, a nitrogen and hydrogen doped silicon carbide SiC(N,H) or multilayers thereof. The dielectric capping layer 13 can be formed utilizing a conventional deposition process such as, for example, chemical vapor deposition (CVD), plasma enhanced chemical vapor deposition (PECVD), chemical solution deposition, evaporation, or plasma enhanced atomic layer deposition (PEALD). In some embodiments and as is illustrated in FIG. 1, the bottom electrode structure 14 has a uppermost surface or portion that is coplanar with a uppermost surface or portion of a dielectric capping layer 13 that may be present laterally adjacent to the bottom electrode structure 14 and on a uppermost surface of the interconnect dielectric material layer 10.

The dielectric capping layer 13 can be formed prior to, or after, constructing the bottom electrode structure 14. In embodiments when the dielectric capping layer 13 is formed prior to the bottom electrode structure 14, a blanket layer of dielectric capping material is formed and thereafter an opening is formed (by photolithography and etching) in the dielectric capping material. The opening may have substantially identical size, shape, and/or dimensions as the bottom electrode structure 14. The bottom electrode structure 14 can be formed in the opening of the dielectric capping layer 13. In such an embodiment, the bottom electrode structure 14 can be formed by deposition of a conductive material into the opening of the dielectric capping layer 13, followed by a planarization process. In embodiments in which the bottom electrode structure 14 is formed prior to the dielectric capping layer 13, the bottom electrode structure 14 is formed by patterning a blanket layer of conductive material, and thereafter dielectric capping material is deposited and a subsequent planarization process may be performed to form the dielectric capping layer 13.

In another example embodiment, the bottom electrode structure 14 can be constructed within a recessed portion of the electrically conductive structure 12. In such an embodiment, an upper portion of the electrically conductive structure 12 may be removed by utilizing a recess etching process. The removed portion of the electrically conductive structure 12 may be substantially identical to a size, shape, and/or dimensions of the bottom electrode structure 14. The conductive material of the bottom electrode structure 14 may be deposited into the recess form in the electrically conductive structure 12. The deposition of the conductive materials into the recess may fill the recess with the conductive material forming a desired size and/shape of the bottom electrical structure 14. Also, in such an embodiment, a planarization process can be utilized to remove any excess conductive material, or to smooth an uppermost surface of the deposited conductive materials to form the uppermost surface of the bottom electrode structure 14. The planarization process can cause the uppermost surface of the bottom electrode structure 14 to be coplanar with the uppermost surface of the interconnect dielectric material layer 10. Also, in such an embodiment, the bottom electrode structure 14 may be located on an entirety of the recess of the electrically conductive structure 12. Also, and in such an embodiment, an upper portion of the interconnect dielectric material layer 10 may be laterally adjacent to each sidewall of the bottom electrode structure 14. Further, and in such an embodiment, the dielectric capping layer 13 may be omitted from the structure.

Figure 2:
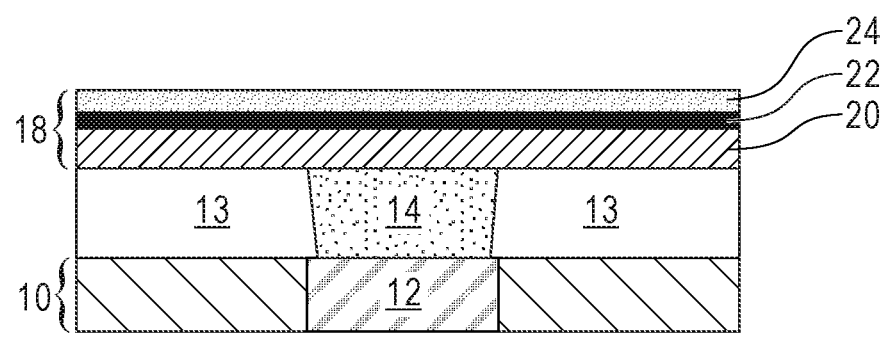
FIG. 2 is a cross sectional view of the exemplary structure of FIG. 1 after depositing a multilayered magnetic tunnel junction (MTJ) stack on the bottom electrode structure.

FIG. 2 is a cross sectional view of the exemplary structure of FIG. 1 after depositing a multilayered magnetic tunnel junction (MTJ) stack 18 on the bottom electrode structure 14. The multilayered magnetic tunnel junction (MTJ) stack 18 is deposited on a portion of the entirely planar uppermost surface of the bottom electrode structure 14 and, if present, the dielectric capping layer 13. The MTJ stack 18 includes at least a magnetic reference layer 20, a tunnel barrier layer 22, and a magnetic free layer 24. In some embodiments (not shown), the MTJ stack 18 may also include a non-magnetic spacer layer located on the magnetic free layer, a second magnetic free layer located on the non-magnetic spacer layer, and/or a MTJ cap layer located on the magnetic free layer 24 or on the second magnetic free layer. Although not shown, the order of the MTJ stack 18 may be reversed such that the magnetic free layer 24 is formed beneath the tunnel barrier layer 18 and the magnetic reference layer 20. In such an embodiment, a metallic seed layer is typically formed on the bottom electrode structure 14 prior to forming the magnetic free layer. The various material layers of the MTJ stack 18 can be formed by utilizing one or more deposition processes such as, for example, plating, sputtering, atomic layer deposition (ALD), chemical vapor deposition (CVD), plasma enhanced chemical vapor deposition (PECVD) or physical vapor deposition (PVD).

In the example shown in FIG. 2, the magnetic reference layer 20 has a fixed magnetization. The magnetic reference layer 20 can be composed of a metal or metal alloy (or a stack thereof) that includes one or more metals exhibiting high spin polarization. In alternative embodiments, exemplary metals for the formation of the magnetic reference layer 20 include iron, nickel, cobalt, chromium, boron, or manganese. Exemplary metal alloys may include the metals exemplified by the above. In another embodiment, the magnetic reference layer 20 may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 22 is composed of an insulator material and is formed at such a thickness as to provide an appropriate tunneling resistance. Exemplary materials for the tunnel barrier layer 22 include magnesium oxide, aluminum oxide, and titanium oxide, or materials of higher electrical tunnel conductance, such as semiconductors or low-bandgap insulators.

The magnetic free layer 24 can be composed of a magnetic material (or a stack of magnetic materials) with a magnetization that can be changed in orientation relative to the magnetization orientation of the magnetic reference layer 20. Exemplary magnetic materials for the magnetic free layer 24 include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer may include one of the magnetic materials mentioned above for magnetic free layer 24. In one embodiment, the second magnetic free layer is composed of a same magnetic material as the magnetic free layer 24. In another embodiment, the second magnetic free layer is composed of a magnetic material that is compositionally different from the magnetic free layer 24.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer may have a thickness from 2 nm to 25 nm; other thicknesses are possible and can be used in the present application as the thickness of the MTJ cap layer.

Figure 3:
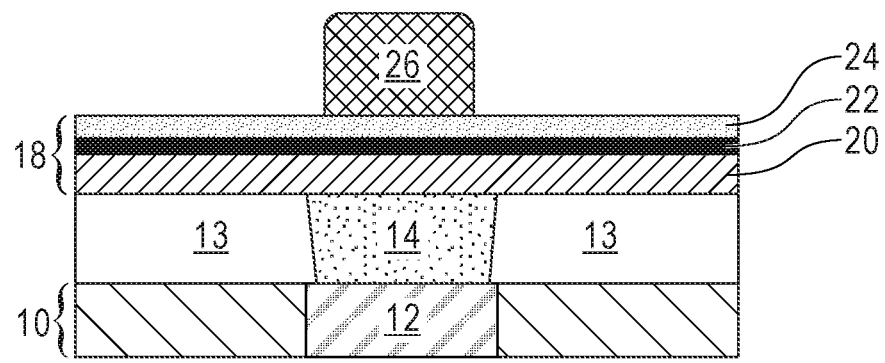
FIG. 3 is a cross sectional view of the structure of FIG. 2 after depositing a top electrode structure on the MTJ stack.

FIG. 3 is a cross sectional view of the structure of FIG. 2 after depositing a top electrode structure 26 on the MTJ stack 18. The top electrode structure 26 is located on the multilayered MTJ stack. In the present application, the top electrode structure 26 may serve as an etch mask. The top electrode structure 26 can be composed of one of the conductive materials mentioned above for the bottom electrode structure 14. The conductive material that provides the top electrode structure 26 is typically compositionally different from the optional MTJ cap layer. The top electrode structure 26 can have a thickness within the thickness range mentioned above for the bottom electrode structure 14. The top electrode structure 26 can be formed utilizing one of the deposition processes mentioned above in providing the bottom electrode structure 14, followed by performing a patterning process, such as, for example, photolithography and etching. A width, or lateral dimension, of the top electrode structure 26 may be less than a width, or lateral dimension, of the bottom electrode structure 14.

It is noted that the drawings of the present application illustrate a device area in which an OTP memory element in accordance with the present application will be formed. A non-OTP memory element device area that includes a MTJ containing device may be present laterally adjacent to the device area containing the OTP memory element. Exemplary MTJ containing devices include, but are not limited to, memory devices (e.g., MRAM, or spin-transfer torque (STT) MRAM), or sensors such as, for example, pressure sensors. In some embodiments, a non-MTJ containing device area may be located adjacent to the OTP memory element device area and, if present, the device area that contains a MTJ containing device. It is also noted that while a single bottom electrode structure and a single top electrode structure are described and illustrated, the present application can be used when a plurality of bottom electrode structures and a plurality of top electrode structure are formed.

Figure 4:
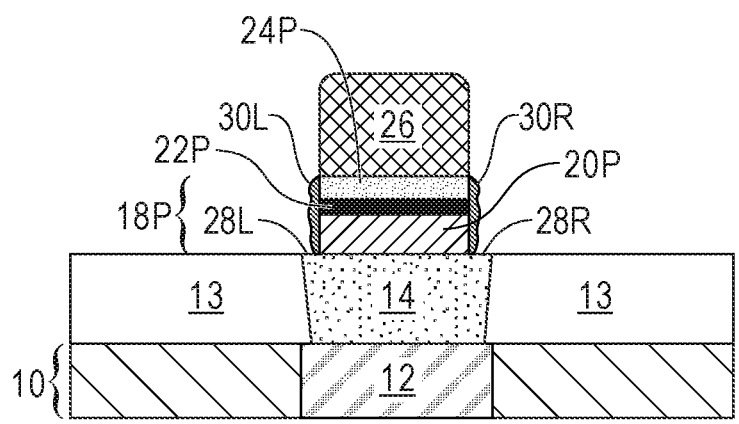
FIG. 4 is a cross sectional view of the structure of FIG. 3 after etching the MTJ stack utilizing the top electrode structure as an etch mask to provide a MTJ pillar, and after inducing redeposition of oxidized metal particles on the MTJ pillar.

FIG. 4 is a cross sectional view of the structure of FIG. 3 after etching the MTJ stack 18 utilizing the top electrode structure 26 as an etch mask to provide a MTJ pillar 18P, and after inducing redeposition of conductive metal particles 30L, 30R on the MTJ pillar 18P. The etching of the multilayered MTJ stack 18 may include one or more etching steps. The one or more etching steps may include one or more reactive ion etching processes. A MTJ pillar 18P can be formed or constructed as a result of performing the one or more etching processes. In some examples, the MTJ pillar 18P and the top electrode structure 26 may be cylindrical in shape. It is noted that other shapes are possible and can be utilized in the present application. Although not shown, another electrically conductive structure can be formed contacting a surface of the top electrode structure 26. This other electrically conductive structure may be embedded in another interconnect dielectric material that is formed laterally adjacent to, and above, the stack including the MTJ pillar 18P and the top electrode structure 26.

As is shown, the MTJ pillar 18P has at least one sidewall that may be vertically aligned to the sidewall of the top electrode structure 26. In some examples, a width, or lateral dimension, of the top electrode structure 26 may be substantially identical to a width, or lateral dimension, of the MTJ pillar 18P. The MTJ pillar 18P may include at least a remaining portion of the magnetic reference layer 20 (hereinafter magnetic reference material 20P), a remaining portion of the tunnel barrier layer 22 (hereinafter tunnel barrier material 22P) and a remaining portion of the magnetic free layer 24 (hereinafter magnetic free material 24P). In some embodiments, the MTJ pillar 18P may also include a remaining portion of the non-magnetic spacer, a remaining portion of the second magnetic reference layer, and/or a remaining portion of the MTJ cap layer. The MTJ pillar 18P has a bottommost surface or portion that forms an interface with the uppermost portion of the bottom electrode structure 14. The bottommost surface of portion of the MTJ pillar 18P has a second dimension that is less than the first dimension.

In some examples, the MTJ pillar 18P can be patterned using, for example, an ion beam etching (IBE) process. In the present application, the etching used in forming the MTP pillar 18P is designed so that a portion of the bottom electrode structure 14 is intentionally exposed such that resputtered metal particles derived from the exposed portion of the bottom electrode structure 14 deposit on the sidewall of the MTJ pillar 18P. This is unlike the non-OTP memory element device area that includes conventional MTJ containing devices in which resputtered metal particles deposition on the sidewalls of the MTP pillar are usually avoided.

Typically, and in the non-OTP memory element device area that includes conventional MTJ containing devices, the etch used to form a MTJ pillar may stop prior to the sidewalls of the MTJ pillar being vertically aligned with the sidewalls of a bottom electrode structure to avoid exposing the bottom electrode structure to the etching process. Thus, the lateral dimension of the bottommost surface or portion of the MTJ pillar in a non-OTP memory element device area that includes conventional MTJ containing devices is typically equal to or larger than the lateral dimension of the uppermost surface or portion of the bottom electrode structure to prevent conductive metal particles from the bottom electrode structure being deposited on the sidewalls, or outermost sidewalls, of the MTJ pillar. However, in the example shown in FIG. 4 and in the OTP memory element device area, a size or dimension (e.g., the lateral dimension) of the MTJ pillar 18P may be selected to be less than a size or dimension of the bottom electrode structure 14 in order to expose the bottom electrode structure 14 to the etching process. As such, the continued etching beyond the sidewalls of the bottom electrode structure 14 may induce redeposition of conductive metal particles 30L, 30R, from the exposed portions of the bottom electrode structure, on the sidewalls of the MTJ pillar 18P.

In an example embodiment, the lateral dimensions of the bottom electrode structure 14, the MTJ pillar 18P, and/or the top electrode structure 26 may be selected such that a width or lateral dimension of the MTJ pillar 18P is less than a width or lateral dimension of the bottom electrode structure 14. It is noted that other dimensions of the bottom electrode structure 14, the MTJ pillar 18P, and/or the top electrode structure 26 may be selected, such as surface area, perimeter, length, width, and/or other dimensions. The dimensions of the bottom electrode structure 14, the MTJ pillar 18P, and/or the top electrode structure 26 may be selected such that at least a portion of the uppermost surface or portion of the bottom electrode structure 14 is exposed to the etching or patterning process to form the MTJ pillar 18P.

The selections of the dimensions may cause the etching of the MTJ pillar 18P to continue past the sidewalls of the bottom electrode structure 14. The etching of the MTJ pillar 18P may continue until the MTJ pillar 18P is sized at the selected lateral dimension. As a result of patterning the MTJ pillar 18P to the selected size and/or dimensions, a top portion 28L and a top portion 28R of the bottom electrode structure 14 may be physically exposed during the etching process. The top portions 28L and 28R may each be adjacent to the sidewalls of the MTJ pillar 18P. In some examples, the top portions 28L and 28R may be substantially the same size. For example, the MTJ pillar 18 may be positioned such that a center of the MTJ pillar 18P aligns with a center of the bottom electrode structure 14, causing the top portions 28L and 28R to be substantially the same size.

As the patterning process of the MTJ pillar 18P continues past the sidewalls of the bottom electrode structure 14, conductive metal particles 30L, 30R from the exposed top portions 28L, 28R of bottom electrode structure 14, deposit on the sidewalls of the MTJ pillar 18P. Thus, a size and/or dimension of the MTJ pillar 18P may be chosen to determine the size of the physically exposed top portions 28L, 28R of the bottom electrode structure 14. The amount of conductive metal particles 30L, 30R being disposed on the sidewalls of the MTJ pillar 18P may increase as the size of the top portions 28L, 28R increases. In some examples, the etching of the MTJ pillar 18P may over-etch into the top portions 28L, 28R of the bottom electrode structure 14, causing the bottom electrode structure 14 to have an uneven uppermost surface.

The conductive metal particles 30L, 30R deposited on the sidewalls of the MTJ pillar 18P can interact with the oxide materials of the tunnel barrier material 22P, and cause unwanted shortening of the OTP element. To avoid this, the conductive metal particles 30L, 30R that are shown in FIG. 4 are subjected to an oxygen treatment to oxidize the conductive metal particles 30L, 30R, forming oxidized metal particles (shown as 30X in FIG. 5). As a result of the oxidation of the conductive metal particles 30L, 30R, a breakdown voltage of the MTJ pillar 18P may be reduced (when compared to the MTJ pillar 18P without the oxidized metal particles 30X). Thus, the MTJ pillar 18P with oxidized metal particles 30X may breakdown earlier when compared to the MTJ pillar 18P without the oxidized metal particles 30X. The reduction amount of the breakdown voltage may be based on the amount of conductive metal particles 30L, 30R deposited on the sidewalls of the MTJ pillar 18P, the materials of the MTJ pillar 18P, the materials of the bottom electrode structure 14, and/or the time in which the structure of FIG. 4 undergoes the oxidation process (e.g., the oxygen treatment).

In an example embodiment, and during the oxygen treatment, the temperature of the oxygen treatment as well as the applied pressure and duration of the oxygen treatment, can be controlled and/or adjusted based on the materials that formed the bottom electrode structure 14 and/or the conductive metal particles 30R, 30L. For example, the oxygen treatment that can be used in the present application can include exposing the structure shown in FIG. 4 to an oxygen-containing ambient such as, for example air, at a temperature of from 20° C. to 200° C., for a duration ranging from five minutes to five hours, and under a pressure ranging from one to one-hundred Torr.

In some example embodiments, protective measures can be applied to at least a region of the structure shown in FIG. 4 prior to the oxygen treatment to protect these regions from potential damages resulting from the oxygen treatment. For example, the entire structure shown in FIG. 4 can be covered with an in-situ layer of SiN film, which can be deposited by PECVD or PVD at low temperature (e.g., 200° C. or less). A block mask can also be used to protect regions other than the OTP regions (e.g., the MTJ pillar 18P with the deposited conductive metal particles 30R, 30L). The OTP regions can be opened up or exposed, such as by removing the SiN film from the OTP regions. The removal can include, for example, using a reactive ion etching process with appropriate materials and/or techniques, or alternatively, an ion beam etch can be used to remove the SiN from the selected OTP regions. Upon exposing the OTP regions, the structure with the exposed OTP regions can undergo the oxygen treatment to oxidize conductive metal particles disposed on the exposed OTP regions while regions other than the exposed OTP regions are protected from the oxygen treatment. In some embodiments, the block mask can be removed using $N_2/H_2$ or other materials and/or techniques.

Figure 5:
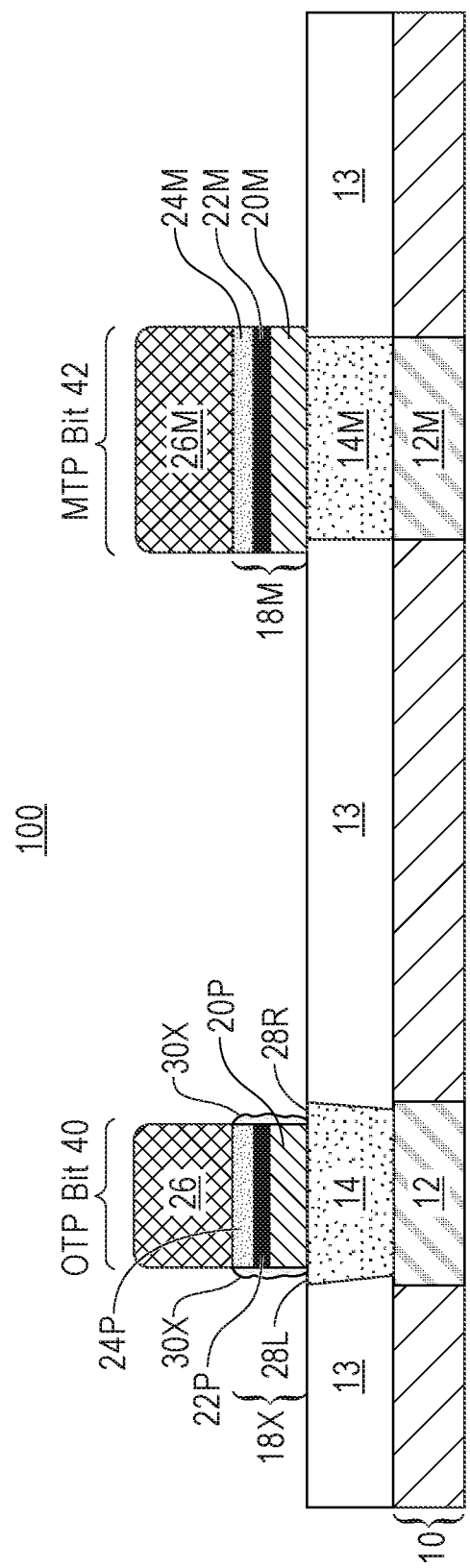
FIG. 5 is a cross sectional view of a memory device including an OTP memory element with oxidized metal particles disposed on a MTJ pillar, the OTP memory element is laterally adjacent to a non-OTP memory element device area that includes a MTJ containing device without oxidized metal particles.

FIG. 5 is a cross sectional view of a memory device including an OTP memory element 40 with oxidized metal particles 30X disposed on a MTJ pillar 18X, where the OTP memory element is laterally adjacent to a non-OTP memory element device area that includes a MTJ containing device (e.g., MTP bit 42) without oxidized metal particles. In the example shown in FIG. 5, a memory device 100 includes at least one OTP bit (or OTP memory element) 40 and at least one multi-time programmable (MTP) bit (or MTP memory element) 42. The OTP bit 40 and the MTP bit 42 may be laterally adjacent to each other, such as being positioned on a same horizontal plane. The OTP bit 40 includes the electrically conductive structure 12 embedded in the interconnect dielectric material layer 10, the bottom electrode structure 14, the top electrode structure 26, and a MTJ pillar 18X, where the MTJ pillar 18X include oxidized metal particles 30X resulting from the oxidation of the conductive metal particles 30L and 30R (shown in FIG. 4). In an example, one bit of data is written to the OTP bit 40 by applying an amount of voltage exceeding a breakdown voltage of the MTJ pillar 18X to cause an electrical short. The OTP bit 40, without voltage being applied, registers a logic bit '1'. The occurrence of the electrical short causes the OTP bit 40 to register as logic '0'. The electrical short is irreversible, thus causing the '0' to be permanently registered at the OTP bit 40. Thus, the OTP bit 40 may function as an anti-fuse device that is initialized with a high resistance and permanently creates an electrically conductive path when the voltage across the anti-fuse device exceeds a particular amount (e.g., breakdown voltage).

The MTP bit 42 includes an electrically conductive structure 12M, which may be same or different in size and/or dimensions when compared to the electrically conductive structure 12 of the OTP bit 40. The electrically conductive structure 12M may be embedded in the interconnect dielectric material layer 10. The MTP bit 42 further includes a bottom electrode structure 14M, which may be same or different in size and/or dimensions when compared to the bottom electrode structure 14 of the OTP bit 40. The MTP bit 42 further includes a MTJ pillar 18M that may have a size and/or dimension larger than the MTJ pillar 18X. The MTJ pillar 18M may have a breakdown voltage larger than the breakdown voltage of the MTJ pillar 18X. The MTP bit 42 further includes a top electrode structure 26M that may have a size and/or dimension larger than the top electrode structure 26 of the OTP bit 40. In an example, the top electrode structure 26M may serve as an etch mask to pattern the MTJ pillar 18M. As is shown, the MTJ pillar 18M has a sidewall that is vertically aligned to the sidewall of the top electrode structure 26M. The MTJ pillar 18M may include a magnetic reference material 20M, a tunnel barrier material 22M, and a magnetic free material 24M.

In an example, a subset of OTP bit(s) 40 is selected for a write operation (e.g., writing data to the memory device 100). A voltage exceeding the breakdown voltage of the OTP bit 40, but less than the breakdown voltage of the MTP bit 42, may be applied to the selected OTP bits. As a result of the OTP bit 40 having a lower breakdown voltage than the MTP bit 42, the selected OTP bits experiences an electrical short and thus registered as logic '0', without accidentally shorting the MTP bit 42 (or other MTP bits of the memory device 100). Therefore, data can be written to the OTP bit(s) without accidentally causing the MTP bit(s) of the memory device 100 to experience electrical shorts.

Further, the methods to construct the OTP memory elements in accordance with the present disclosure can be implemented in conjunction with the fabrication of MTP bits, which may improve an efficiency of manufacturing memory devices that comprises both OTP and MTP memory elements. For example, patterning of the MTP memory elements may stop at, or prior to, the bottom electrode structure 14M being exposed to the patterning process to prevent sidewall redeposition. But patterning of the OTP memory elements on the same wafer may continue to expose a portion of the bottom electrode structure 14 such that redeposition may be induced during the patterning process. A layout of the OTP memory elements and the MTP memory elements on the wafer of the memory device can be designed to allow fabrication of OTP and MTP memory elements in conjunction. For example, a design may have a plurality of OTP memory elements on a first section of a wafer, and have a plurality of MTP memory elements on a second section of the same wafer. A patterning process can be performed on the second section of the wafer for a first duration to pattern the MTP memory elements, and the patterning process can be performed on the first section of the wafer for a second duration, which is longer than the first duration, to pattern the OTP memory elements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory element comprising:
   a bottom electrode structure having an uppermost portion of a first dimension and composed of an upper conductive material, wherein the uppermost portion of the bottom electrode structure has an uneven uppermost surface, the bottom electrode structure including the uppermost portion is entirely embedded in a dielectric capping layer that is located on an interconnect level comprising an electrically conductive structure embedded in an interconnect dielectric material layer, and wherein the bottom electrode structure has a bottommost surface that is entirely in direct physical contact with the electrically conductive structure;
   a MTJ pillar having a bottommost portion forming an interface with the uppermost portion of the bottom electrode structure, wherein the bottommost portion of the MTJ pillar has a second dimension that is less than the first dimension;
   oxidized metal particles of the upper conductive material located on an outermost sidewall of the MTJ pillar, wherein an amount of the oxidized metal particles located on the outermost sidewalls of the MTJ pillar defines a reduction amount of a breakdown voltage of the MTJ pillar from a first breakdown voltage to a second breakdown voltage, the first breakdown voltage being an initial breakdown voltage of the MTJ pillar without the oxidized metal particles located on the outermost sidewalls of the MTJ pillar, and the second breakdown voltage being a final breakdown voltage of the MTJ pillar with the oxidized metal particles located on the outermost sidewalls of the MTJ pillar; and
   a top electrode structure located on the MTJ pillar.

2. The memory element of claim 1, wherein the amount of oxidized metal particles is based on a difference between the first dimension and the second dimension.

3. The memory element of claim 1, wherein the bottom electrode structure, the MTJ pillar, and the top electrode structure are components of a one-time programmable (OTP) memory element.

4. A memory device comprising:
   a first memory element including:
      a first bottom electrode structure having an uppermost portion of a first dimension and composed of an upper conductive material, wherein the uppermost portion of the bottom electrode structure has an uneven uppermost surface, the bottom electrode structure including the uppermost portion is entirely embedded in a dielectric capping layer that is located on an interconnect level comprising an electrically conductive structure embedded in an interconnect dielectric material layer, and wherein the bottom electrode structure has a bottommost surface that is entirely in direct physical contact with the electrically conductive structure;

a first MTJ pillar having a bottommost portion forming an interface with the uppermost portion of the first bottom electrode structure, wherein the bottommost portion of the first MTJ pillar has a second dimension that is less than the first dimension;

oxidized metal particles of the upper conductive material located on an outermost sidewall of the first MTJ pillar, wherein an amount of the oxidized metal particles located on the outermost sidewalls of the MTJ pillar defines a reduction amount of a breakdown voltage of the MTJ pillar from a first breakdown voltage to a second breakdown voltage, the first breakdown voltage being an initial breakdown voltage of the first memory element without the oxidized metal particles located on the outermost sidewalls of the MTJ pillar, and the second breakdown voltage being a final breakdown voltage of the first memory element with the oxidized metal particles located on the outermost sidewalls of the MTJ pillar; and a top electrode structure located on the first MTJ pillar, wherein the oxidized metal particles are absent from an outermost sidewall of the top electrode structure;

a second memory element including:
  a second bottom electrode structure having an uppermost portion of a third dimension;
  a second MTJ pillar having a bottommost portion of a fourth dimension that is greater than the third dimension, wherein the oxidized metal particles are absent on sidewalls of the second MTJ pillar, and a breakdown voltage of the second memory element including the second MTJ pillar is greater than the final breakdown voltage of the first memory element including the first MTJ pillar.

5. The memory device of claim 4, wherein the first memory element is a one-time programmable (OTP) memory element.

6. The memory device of claim 4, wherein the second memory element is a multi-time programmable (MTP) memory element.

7. The memory device of claim 4, wherein a size of the second MTJ pillar of the second memory element is larger than a size of the first MTJ pillar of the first memory element.

8. The memory device of claim 4, wherein the amount of oxidized metal particles is based on a difference between the first dimension and the second dimension.

9. The memory device of claim 4, wherein:
  the first memory element is a one-time programmable (OTP) memory element that experiences an irreversible electrical short in response to an application of a bias voltage that is equal to or greater than the breakdown voltage of the first memory element; and
  the second memory element is a multi-time programmable (MTP) memory element.

* * * * *